United States Patent
Shirai et al.

(10) Patent No.: US 11,817,309 B2
(45) Date of Patent: Nov. 14, 2023

(54) METHOD OF PRODUCING HEATED OZONE WATER, HEATED OZONE WATER, AND SEMICONDUCTOR WAFER-CLEANING LIQUID

(71) Applicants: TOHOKU UNIVERSITY, Sendai (JP); NOMURA MICRO SCIENCE CO., LTD., Atsugi (JP)

(72) Inventors: Yasuyuki Shirai, Sendai (JP); Takeshi Sakai, Sendai (JP); Takayuki Jizaimaru, Atsugi (JP)

(73) Assignees: TOHOKU UNIVERSITY, Sendai (JP); NOMURA MICRO SCIENCE CO., LTD., Atsugi (JP)

( * ) Notice: Subject to any disclaimer, the term of this patent is extended or adjusted under 35 U.S.C. 154(b) by 382 days.

(21) Appl. No.: 17/078,169

(22) Filed: Oct. 23, 2020

(65) Prior Publication Data

US 2021/0043440 A1    Feb. 11, 2021

Related U.S. Application Data

(63) Continuation of application No. PCT/JP2019/017986, filed on Apr. 26, 2019.

(30) Foreign Application Priority Data

May 2, 2018 (JP) ................................. 2018-088715

(51) Int. Cl.
*H01L 21/302* (2006.01)
*H01L 21/02* (2006.01)
(Continued)

(52) U.S. Cl.
CPC .... *H01L 21/02057* (2013.01); *B01F 23/2319* (2022.01); *B01F 23/811* (2022.01);
(Continued)

(58) Field of Classification Search
CPC ........................................................ H01L 21/302
(Continued)

(56) References Cited

U.S. PATENT DOCUMENTS

2002/0011257 A1*   1/2002   Degendt .................. G03F 7/42
                                                              257/E21.228

FOREIGN PATENT DOCUMENTS

JP    2001-035827 A    2/2001
JP    2003-142449 A    5/2003
(Continued)

OTHER PUBLICATIONS

International Search Report dated Jun. 11, 2019 in PCT/JP2019/017986 filed on Apr. 26, 2019, 2 pages.
(Continued)

*Primary Examiner* — Gregory E Webb
(74) *Attorney, Agent, or Firm* — Oblon, McClelland, Maier & Neustadt, L.L.P.

(57) ABSTRACT

Provided are: a method of producing heated ozone water, the method capable of producing heated ozone water having an extremely high ozone concentration by suppressing a reduction in the ozone concentration in high-concentration heated ozone water; heated ozone water; and a semiconductor wafer-cleaning liquid using the heated ozone water. A method of producing heated ozone water obtained by dissolving ozone in pure water, the method being characterized by including: adjusting a pH of the pure water to 3 or less by adding acid to the pure water; to obtain an acid water, dissolving an ozone gas in the acid water; and heating the pure water, the acid water or the ozone water, to 60° C. or more.

20 Claims, 5 Drawing Sheets

(51) Int. Cl.
  *B08B 3/10* (2006.01)
  *B08B 3/08* (2006.01)
  *C02F 1/68* (2023.01)
  *C11D 3/04* (2006.01)
  *C11D 11/00* (2006.01)
  *G03F 7/42* (2006.01)
  *C11D 3/39* (2006.01)
  *B01F 23/80* (2022.01)
  *B01F 23/23* (2022.01)
  *B01F 23/237* (2022.01)
  *B01F 101/48* (2022.01)
  *B01F 101/00* (2022.01)

(52) U.S. Cl.
  CPC ............... *B08B 3/08* (2013.01); *B08B 3/10* (2013.01); *C02F 1/68* (2013.01); *C11D 3/04* (2013.01); *C11D 3/3947* (2013.01); *C11D 11/0047* (2013.01); *G03F 7/423* (2013.01); *B01F 23/237613* (2022.01); *B01F 2101/4505* (2022.01); *B01F 2101/48* (2022.01); *B01F 2215/044* (2013.01); *B08B 2203/005* (2013.01); *B08B 2203/007* (2013.01)

(58) Field of Classification Search
  USPC ........................................................ 510/175
  See application file for complete search history.

(56) References Cited

FOREIGN PATENT DOCUMENTS

| | | |
|---|---|---|
| JP | 2006-295091 A | 10/2006 |
| JP | 2007-236706 A | 9/2007 |
| JP | 2009-297588 A | 12/2009 |
| JP | 2013184072 A | 9/2013 |
| JP | 2002045665 A | 2/2022 |
| TW | 201222173 A1 | 6/2012 |
| WO | WO 01/05702 A1 | 1/2001 |
| WO | WO 2009/082008 A1 | 7/2009 |

OTHER PUBLICATIONS

Japanese Office Action dated Sep. 10, 2020 in Japanese Application 2019-541216, 8 pages (with English Translation).

\* cited by examiner

METHOD OF PRODUCING HEATED OZONE WATER, HEATED OZONE WATER, AND SEMICONDUCTOR WAFER-CLEANING LIQUID

CROSS-REFERENCE TO RELATED APPLICATIONS

This application is a continuation of prior International Application No. PCT/JP2019/017986, filed on Apr. 26, 2019 which is based upon and claims the benefit of priority from Japanese Patent Application No. 2018-88715, filed on May 2, 2018; the entire contents of all of which are incorporated herein by reference.

FIELD

The present invention relates to a method of producing heated ozone water, heated ozone water, and a semiconductor wafer-cleaning liquid.

BACKGROUND

Conventionally, stripping and cleaning of a resist on an electronic material in a field of producing a semiconductor substrate, a liquid crystal display, an organic EL display, a photomask thereof, and so on, are normally performed in the order of "SPM cleaning", "rinse cleaning", "APM cleaning", "rinse cleaning", "HPM cleaning", "rinse cleaning", "DHF cleaning", "rinse cleaning", and "drying".

In the above-described resist stripping and cleaning step, the resist stripping is first performed on the resist-adhered electronic material through SPM cleaning using a sulfuric acid-hydrogen peroxide solution (SPM) obtained by mixing sulfuric acid and a hydrogen peroxide solution, and after that, wet cleaning such as APM cleaning using ammonia-hydrogen peroxide solution (APM), HPM cleaning using a hydrochloric acid-hydrogen peroxide solution (HPM), or DHF cleaning using dilute hydrofluoric acid (DHF), is performed. After that, drying is further performed, to finish the series of cleaning treatment. Note that between the cleaning step and the cleaning step using different chemical solutions, rinse cleaning using pure water is performed. Further, the HPM cleaning and the DHF cleaning are sometimes omitted.

In recent years, in accordance with advancement of miniaturization, high function, and high performance of an electronic material, a production process of the electronic material becomes complicated, and at the same time, resist stripping treatment of the electronic material becomes difficult. Further, an amount of chemical solution used for the resist stripping treatment becomes large, and in order to perform treatment on a waste liquid discharged by the resist stripping treatment step, a large amount of energy and cost is required, which becomes a large environmental burden.

Accordingly, as measures against these, there is proposed a method of using, as a substitute, ozone water containing a contaminant whose amount is smaller than that of the conventional cleaning liquid, and which is changed to a harmless substance over time (refer to JP-A No. 2009-297588, for example). Further, as a method of producing high-concentration ozone water, there is also proposed a method of producing ozone water containing ozone of about 70 ppm, by blowing ozone in acid such as a citric acid, an acetic acid, or a formic acid, and diluting this with pure water, or by blowing ozone in pure water containing acid (refer to JP-A No. 2001-35827, for example).

However, even with the use of the ozone water containing ozone of about 70 ppm described in JP-A No. 2001-35827, a removal rate of resist is slower than that of the cleaning liquid of SPM, APM, HPM, DHF, or the like described above. Accordingly, it can be considered to improve a cleaning effect by using heated ozone water obtained by heating ozone water, but, under the present situation, there is still room for improvement regarding the removal rate of resist even in heated ozone water at 80° C. with an ozone concentration of 110 ppm described in JP-A No. 2009-297588. If a temperature of the ozone water is tried to be increased for the purpose of improving the resist removing performance, ozone in the ozone water is decomposed to lower the ozone concentration, so that it is difficult to obtain high-concentration heated ozone water, and a method of removing a resist by using ozone water is not yet in practical use industrially.

SUMMARY

The present invention has been made for solving the above-described problems, and an object thereof is to provide a method of producing heated ozone water, the method capable of producing heated ozone water having an extremely high ozone concentration by suppressing a reduction in the ozone concentration in high-concentration heated ozone water, heated ozone water, and a semiconductor wafer-cleaning liquid using the heated ozone water.

A method of producing heated ozone water of the present invention is a method of producing heated ozone water obtained by dissolving ozone in pure water, the method being characterized by including: a pH adjustment step of adjusting a pH of the pure water to 3 or less by adding acid to the pure water; a dissolution step of dissolving an ozone gas in the pure water having the adjusted pH after the pH adjustment step; and a heating step of heating the pure water, the pure water having the adjusted pH, or the ozone water after the dissolution step, to 60° C. or more.

In the method of producing the heated ozone water of the present invention, it is preferable that the acid is a hydrochloric acid, an acetic acid, or a citric acid.

In the method of producing the heated ozone water of the present invention, it is preferable that the dissolution step is performed by at least one kind of method selected from membrane dissolution using a gas permeable membrane, pressure dissolution using a pressure tank, bubbling, and packed tower contact dissolution.

In the method of producing the heated ozone water of the present invention, it is preferable that, when the dissolution step is performed by the membrane dissolution, the gas permeable membrane is a membrane formed of a fluorine-based material.

In the method of producing the heated ozone water of the present invention, it is preferable that, when the dissolution step is performed by the membrane dissolution, the heating step is performed before the dissolution step.

In the method of producing the heated ozone water of the present invention, it is preferable that, when the dissolution step is performed by the pressure dissolution, the heating step is performed after the dissolution step.

In the method of producing the heated ozone water of the present invention, it is preferable that an ozone concentration of the heated ozone water is 70% or more of a saturated dissolution concentration determined by the following method.

(Saturated Dissolution Concentration)

The following equation (1) is transformed to determine x, and a value of the x is converted into a unit of mg/L, to calculate the saturated dissolution concentration.

$$H = p/x \quad (1)$$

In the equation (1), H denotes the Henry's constant in saturated ozone water, and is a value determined from the Roth-Sullivan equation expressed by the following equation (2). p (atm) denotes a partial pressure of ozone in gas which is brought into contact with the saturated ozone water, and is calculated from an ozone gas concentration [g/m$^3$] and a water pressure [MPa] when performing the dissolution step x denotes a molar fraction of ozone in the saturated ozone water.

$$H = 3.842 \times 10^7 [OH^-]^{0.035 exp(-2428/T)} \quad (2)$$

In the equation (2), [OH$^-$] denotes a concentration of hydroxide ion, and T denotes a liquid temperature.

Heated ozone water of the present invention is heated ozone water including heated pure water in which ozone is dissolved, and is characterized in that a pH of the heated ozone water is 3 or less, a temperature of the heated ozone water is 60° C. or more, and an ozone concentration of the heated ozone water is expressed by the following equation (3).

$$\text{Ozone concentration [mg/L]} \geq 350 - 2.5 \times \text{liquid temperature of ozone water [° C.]} \quad (3)$$

The heated ozone water of the present invention preferably contains a hydrochloric acid, an acetic acid, or a citric acid.

A semiconductor wafer-cleaning liquid of the present invention is characterized in that it includes the heated ozone water of the present invention. The semiconductor wafer-cleaning liquid of the present invention is preferably a resist stripping liquid.

According to the present invention, it is possible to provide a method of producing heated ozone water, the method capable of producing heated ozone water having an extremely high ozone concentration by suppressing a reduction in the ozone concentration in high-concentration heated ozone water, heated ozone water, and a semiconductor wafer-cleaning liquid using the heated ozone water.

DETAILED DESCRIPTION

Figure 1:
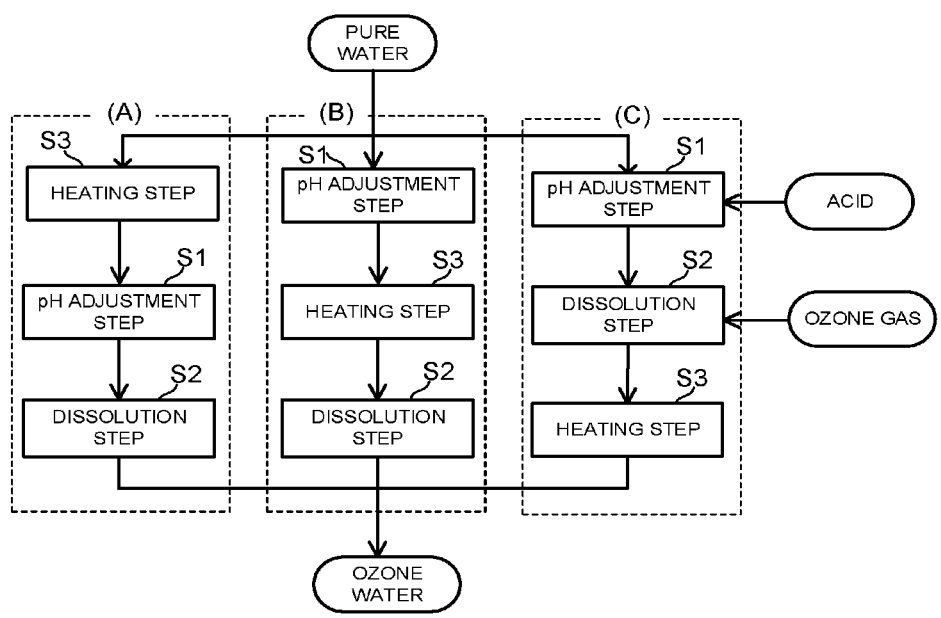
FIG. 1 is a flow chart illustrating a method of producing heated ozone water of an embodiment.

Hereinafter, embodiments of a method of producing heated ozone water, heated ozone water, and a semiconductor wafer-cleaning liquid of the present invention will be described while referring to the drawings. Note that the present invention is not limited to these embodiments, and these embodiments can be changed or modified without departing from the gist and the scope of the present invention.

In the present specification, a saturated dissolution concentration indicates a value calculated in a manner that the following equation (1) is transformed to determine x, and a value of the x is converted into a unit of mg/L.

$$H = p/x \quad (1)$$

In the equation (1), H denotes the Henry's constant in saturated ozone water, and is a value determined from the Roth-Sullivan equation expressed by the following equation (2). p (atm) denotes a partial pressure of ozone in gas which is brought into contact with the saturated ozone water, and x denotes a molar fraction of ozone in the saturated ozone water. In the method of producing the heated ozone water of the embodiment, the aforementioned p is calculated from an ozone gas concentration [g/m$^3$] and a water pressure [MPa] when performing the dissolution step.

$$H = 3.842 \times 10^7 [OH^-]^{0.034 exp(-2428/T)} \quad (2)$$

In the equation (2), [OH$^-$] denotes a concentration of hydroxide ion, and T denotes a liquid temperature. [OH$^-$] can be converted from a pH.

[Method of Producing Heated Ozone Water]

FIG. 1 is a flow chart illustrating a method of producing heated ozone water of an embodiment. The method of producing the heated ozone water of the embodiment is a method of producing heated ozone water obtained by dissolving ozone in pure water, and it includes: a pH adjustment step S1 of adjusting a pH of the pure water to 3 or less by adding acid to the pure water; a dissolution step S2 of dissolving an ozone gas in the pure water having the adjusted pH after the pH adjustment step S1; and a heating step S3 of heating the pure water, the pure water having the adjusted pH (which is also referred to as "acid water", hereinbelow), or the ozone water after the dissolution step S2, to 60° C. or more.

In the method of producing the heated ozone water of the embodiment, the order of executing the pH adjustment step S1, the dissolution step S2, and the heating step S3, is not particularly limited as long as the dissolution step S2 is performed after the pH adjustment step S1 Specifically, the time of executing the heating step S3 in the above-described three steps does not matter. Concretely, as the order of the respective steps, there can be cited an order of (A), (B), or (C) illustrated in FIG. 1.

(A) indicates a case where the respective steps are performed in the order of the heating step S3, the pH adjustment step S1, and the dissolution step S2.

(B) indicates a case where the respective steps are performed in the order of the pH adjustment step S1, the heating step S3, and the dissolution step S2.

(C) indicates a case where the respective steps are performed in the order of the pH adjustment step S1, the dissolution step S2, and the heating step S3.

In the heating step S3, an object to be heated is pure water in the case of (A), the object is acid water in the case of (B), and the object is ozone water in the case of (C). Note that in the method of producing the heated ozone water of the embodiment, the heating step S3 may be performed two times or more according to need. For example, in (A) or (B), the heating step S3 may be additionally performed after the dissolution step S2.

A preferable order of executing the pH adjustment step S1, the dissolution step S2, and the heating step S3 is different depending on the type of the dissolution step S2. Concrete types of the dissolution step S2 and the preferable order of the respective steps corresponding thereto are as described below. Hereinafter, the respective steps will be described.

(pH Adjustment Step S1)

The pH adjustment step S1 is a step of adjusting a pH of pure water to 3 or less by adding acid to the pure water. By setting the pH to 3 or less, an ozone concentration of obtained heated ozone water can be increased with a saturated dissolution concentration set as an index, as will be described later, it can be increased to, preferably, a concentration close to the saturated dissolution concentration, and further, the ozone concentration can be stably maintained.

In the pH adjustment step S1, the pH is preferably set to 2.5 or less from a viewpoint of making the ozone concentration of the obtained heated ozone water to be further close to the saturated dissolution concentration. Note that the pH is preferably 1 or more because of an increase in an amount of acid used for adjusting the pH. Further, when an organic acid is used as the acid, the pH is preferably 1.5 or more, and more preferably 1.7 or more, from a viewpoint that decomposition of the organic acid is likely to occur and thus high-concentration heated ozone water becomes difficult to be obtained.

In the method of producing the heated ozone water of the embodiment, as the pure water used for the pH adjustment step S1, there can be cited pure water with purity at which a resistivity is 10 MΩ·cm or more, for example. As the pure water, it is only required to use pure water with appropriate purity according to the application of the obtained heated ozone water. When the heated ozone water obtained by the method of producing the heated ozone water of the embodiment is used for cleaning a semiconductor wafer, for example, for performing resist stripping, the pure water to be used is preferably ultrapure water with the resistivity of 18 MΩ·cm or more, for example.

As the acid which is added to the pure water, any acid can be employed as long as it can make the pH of the pure water to be 3 or less. As the acid to be added, concretely, there can be cited an organic acid having a carboxy group such as a citric acid, an acetic acid, a formic acid, a propionic acid, an oxalic acid, a malic acid, a butyric acid, a malonic acid, a succinic acid, a maleic acid, a benzoic acid, or a terephthalic acid, a sulfonic acid such as a benzenesulfonic acid or a methanesulfonic acid, or an inorganic acid such as a hydrochloric acid, a nitric acid, or a sulfuric acid. One kind of them may be used independently or two kinds or more of them may be used in a combined manner.

The acid which is added to the pure water is appropriately selected according to, other than the pH adjustment, the application of the heated ozone water, handleability, and an ozone concentration of the obtained heated ozone water, for example, a ratio (%) of the ozone concentration of the obtained heated ozone water to a saturated dissolution concentration. When the heated ozone water is used for cleaning a semiconductor wafer, for example, when it is used for resist stripping, it is preferable to use acid by which an object to be cleaned, for example, a resist-adhered substrate or the like is not contaminated. When these conditions are taken into consideration, as the acid, the hydrochloric acid, the acetic acid, or the citric acid is particularly preferable.

Generally, ozone is a strong oxidant, and when a concentration thereof is high, various oxidation reactions are caused. The present inventors found out that the organic acid such as the citric acid stabilizes the ozone water without being influenced by a decomposition reaction of ozone under the condition where the ozone water has a high concentration and a high temperature as in the present embodiment. Further, a reaching ozone concentration of the nitric acid and the sulfuric acid, among the inorganic acids, becomes slightly lower than that of the hydrochloric acid. It can be estimated that this is because the form of each of the nitric acid and the sulfuric acid is turned into a different one by ozone, and thus ozone is consumed.

An amount of acid added to the pure water is an amount at which the pH of the pure water is set to 3 or less. The amount of acid added to the pure water is preferably an amount at which the pH is set to 2.5 or less.

When the heating step S3 is performed before the pH adjustment step S1 as illustrated in (A) of FIG. 1, the pure water used in the pH adjustment step S1 is pure water heated to 60° C. or more. The heating step S3 will be described later.

(Dissolution Step S2)

The dissolution step S2 is a step in which an ozone gas is dissolved in the pure water having the adjusted pH (acid water) after the pH adjustment step S1. As the ozone gas dissolved in the acid water, an ozone gas obtained from an oxygen gas through a publicly-known method can be used with no particular limitation. The ozone gas is obtained as a mixed gas of the oxygen gas and the ozone gas, and is supplied to the dissolution step. A concentration of the ozone gas used in the dissolution step S2 is preferably 200 to 500 g/m$^3$, more preferably 200 g/m$^3$ or more, still more preferably 300 g/m$^3$ or more, and particularly preferably 350 g/m$^3$ or more.

Concretely, the dissolution step S2 can be performed by methods such as membrane dissolution using a gas permeable membrane, pressure dissolution using a pressure tank, bubbling, and packed tower contact dissolution. The dissolution step S2 may be performed by using any one of these dissolution methods, or it may also be performed by combining two or more of the methods. In the method of producing the embodiment, it is preferable to use the membrane dissolution independently, the pressure dissolution independently, or the membrane dissolution and the pressure dissolution in a combined manner.

Any of the above-described respective dissolution methods is performed by using a predetermined device. As the predetermined device, a membrane dissolution module is used for the membrane dissolution, a pressure tank is used for the pressure dissolution, a bubbling tower is used for the bubbling, and a packed tower is used for the packed tower contact dissolution. The dissolution step is performed in a manner that the acid water and the ozone gas are supplied into the predetermined device according to each method, and are brought into contact with each other. Note that in the pressure dissolution, the acid water and the ozone gas may be separately supplied into the pressure tank, or they may also be supplied in a previously mixed state. In the dissolution methods other than the pressure dissolution, the acid water and the ozone gas are separately supplied into the various devices.

A ratio of supply amounts of the acid water and the ozone gas with respect to various devices in the dissolution step S2 can be appropriately selected. For example, when the ozone concentration of the obtained heated ozone water is made to be close to the saturated dissolution concentration, concretely, when the ozone concentration is set to 70% or more, it is required to supply a sufficient amount of ozone gas with respect to the acid water. Further, from a viewpoint of productivity, the supply of ozone gas whose amount greatly exceeds the required amount, is not preferable. From such a viewpoint, the ratio of supply amounts of the acid water and the ozone gas is preferably, by a volume ratio of acid water:ozone gas, in a range of 1:0.5 to 1:20, more preferably in a range of 1:0.7 to 1:7, still more preferably in a range of 1:0.7 to 1:5, particularly preferably in a range of 1:1 to 1:5, and most preferably in a range of 1:1 to 1:3.

Detailed conditions regarding the method of bringing the acid water and the ozone gas into contact with each other, the method of supplying the acid water and the ozone gas into the predetermined device, and so on, in the dissolution step S2, depend on the dissolution method to be used. The description regarding the detailed conditions for each dissolution method will be made in the description using a production apparatus to be described later.

(Heating Step S3)

The heating step S3 is performed before the pH adjustment step S1, between the pH adjustment step S1 and the dissolution step S2, or after the dissolution step S2, as in the step order of (A), (B), or (C) illustrated in FIG. 1.

Although depending also on the type of the dissolution step S2, when employing the step order (A), there is an advantageous point that a load on a heating device to be used is small since the pure water is heated, but, on the other hand, a process from when a temperature is increased to when the heated ozone water is taken out is long, which is disadvantageous in terms of maintenance of temperature. Further, depending on conditions, there is a possibility that decomposition of ozone proceeds, and the ozone concentration is reduced. However, the heating device is not brought into contact with ozone, so that it is possible to arbitrarily select a material of the heating device.

In the case of the step order (C), the ozone water can be taken out right after the temperature thereof is increased, which is advantageous in terms of the maintenance of temperature, but, on the other hand, a load is imposed on the heating device since the acid ozone water is heated, which is a disadvantageous point. The reduction in the ozone concentration due to the decomposition of ozone can be minimized. However, the heating device heats the ozone water with low pH, so that there is a need to select a material of the heating device. The step order (B) has advantageous points and disadvantageous points, which are between those of the step order (A) and those of the step order (C).

In the heating step S3, the pure water, the acid water, or the ozone water is heated from about room temperature (20 to 25° C.) to 60° C. or more, in accordance with the order of the above-described steps. In order to improve cleaning performance of the heated ozone water, a heating temperature is preferably 70° C. or more, and more preferably 80° C. or more. From a viewpoint of suppressing the reduction in the ozone concentration of the heated ozone water, the heating temperature is preferably 90° C. or less, and more preferably 85° C. or less.

For heating the pure water, the acid water, or the ozone water, it is possible to use a heating device which generally heats liquid, for example, a plate heat exchanger or a heater.

Here, the preferable order of the respective steps in the method of producing the heated ozone water of the embodiment is different depending on the type of the dissolution step S2, as described above. Concretely, when the dissolution step S2 is performed by the membrane dissolution, the heating step S3 is preferably performed before the dissolution step S2. Specifically, it is preferable that the respective steps are performed in the order of (A) or (B) illustrated in FIG. 1. By performing the respective steps in this order, the reduction in the ozone concentration in the heated ozone water is likely to be suppressed. If the respective steps are performed in the order of (A), in particular, the reduction in the ozone concentration in the heated ozone water can be further suppressed.

Further, when the dissolution step S2 is performed by the pressure dissolution, the bubbling, or the packed tower contact dissolution, the heating step S3 is preferably performed after the dissolution step S2. Specifically, it is preferable that the respective steps are performed in the order of (C) illustrated in FIG. 1. When the dissolution step S2 is performed by the pressure dissolution, the bubbling, or the packed tower contact dissolution, a residence time until when the ozone gas is dissolved in the acid water to produce the ozone water in the device used in the dissolution step S2 is long. Therefore, if the heating step S3 is performed before the dissolution step S2, it becomes difficult to keep a liquid temperature to a state during the heating. Further, since a load is imposed on the device used for the dissolution step S2, for example, a pump or the like when using the pressure tank, it is disadvantageous to perform the heating step S3 before the dissolution step S2. The performance of the heating step S3 after the dissolution step S2 eliminates these disadvantageous points, which is preferable.

Further, when the dissolution step S2 is performed by combining the pressure dissolution and the membrane dissolution, the heating step S3 is preferably performed after the dissolution step S2 based on reasons similar to those described above.

Hereinafter, the method of producing the heated ozone water of the embodiment will be concretely described while referring to the drawings, by exemplifying apparatuses of producing heated ozone water in a case where the membrane dissolution is used independently, a case where the pressure dissolution is used independently, and a case where the membrane dissolution and the pressure dissolution are used in a combined manner, respectively, as the dissolution method. Note that a preferable order of performing the heating step S3 is different depending on the dissolution method in the dissolution step S2. The following examples of production apparatus are examples of production apparatus set to perform the respective steps in a preferable order in accordance with the dissolution method.

Figure 2:
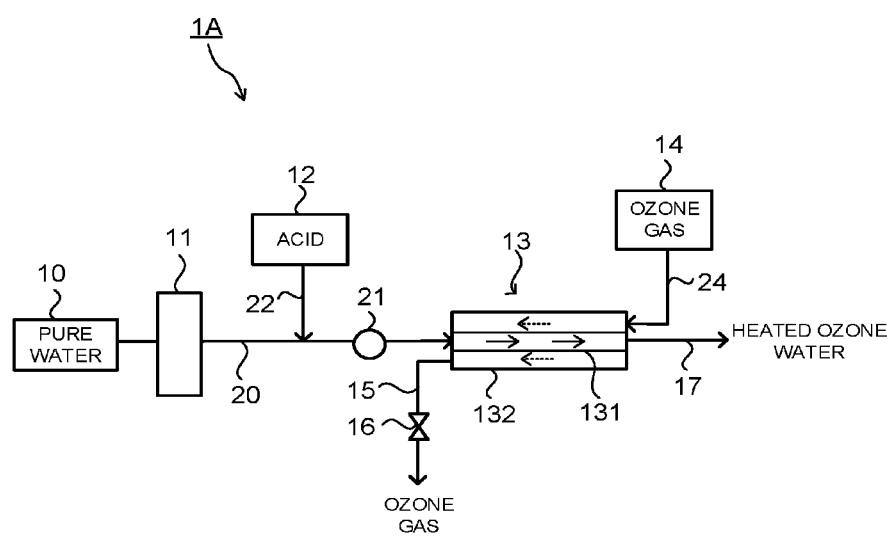
FIG. 2 is a schematic configuration diagram of one example of a production apparatus when a dissolution step is performed by membrane dissolution in the method of producing the heated ozone water of the embodiment.
Figure 3:
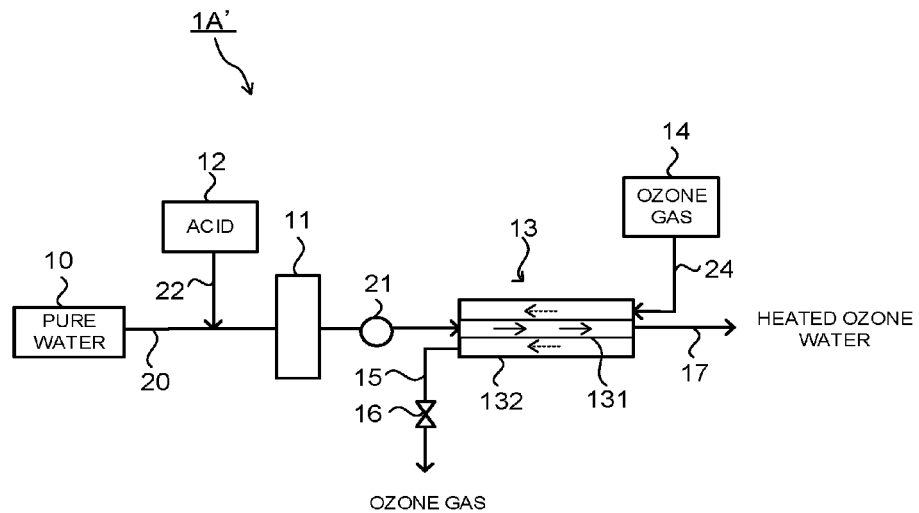
FIG. 3 is a schematic configuration diagram of another example of the production apparatus when the dissolution step is performed by the membrane dissolution in the method of producing the heated ozone water of the embodiment.

FIG. 2 and FIG. 3 are schematic configuration diagrams of production apparatuses 1A and 1A' when the dissolution step is performed by the membrane dissolution in the method of producing the heated ozone water of the embodiment. When the dissolution step is performed by the membrane dissolution, the heating step is preferably performed before the dissolution step. The production apparatus 1A is an example of an apparatus of producing heated ozone water for producing the heated ozone water in the step order of (A) in FIG. 1, and the production apparatus 1A' is an example of an apparatus of producing heated ozone water for producing the heated ozone water in the step order of (B) in FIG. 1. The performance of the heating step before the dissolution step is disadvantageous in a point that it takes a long time to supply the ozone water from the dissolution step, but, the ozone water is highly stabilized under the condition of the present embodiment, so that this condition does not become a problem. Since it is possible to suppress the decomposition of ozone when the heating device at a time of performing the heating and the ozone water are brought into contact with each other, the heating step is preferably performed before the dissolution step.

Figure 4:
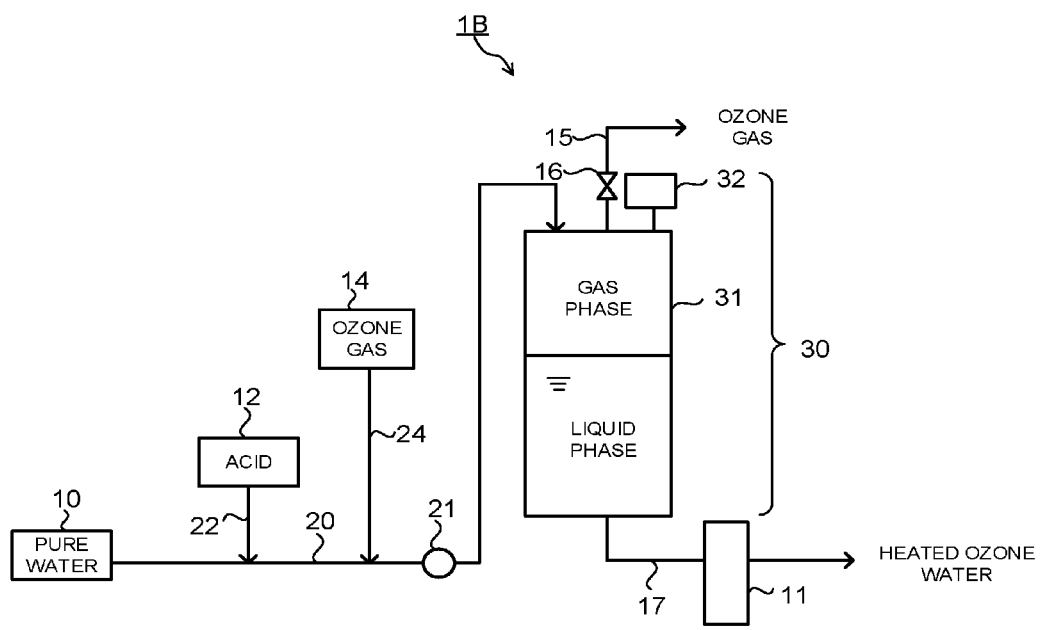
FIG. 4 is a schematic configuration diagram of a production apparatus when the dissolution step is performed by a pressure tank in the method of producing the heated ozone water of the embodiment.
Figure 5:
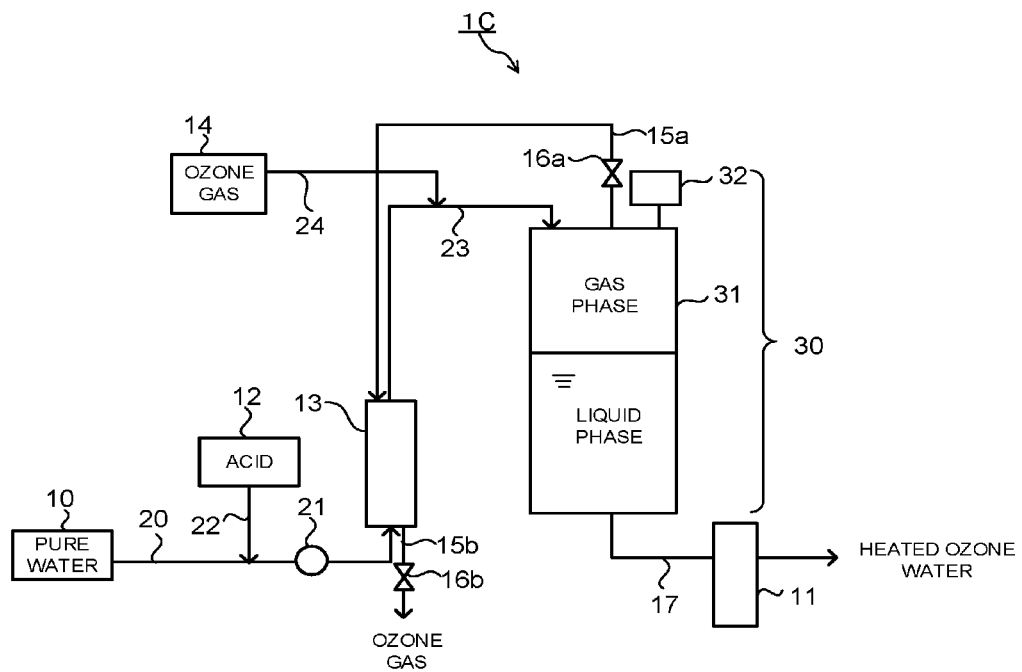
FIG. 5 is a schematic configuration diagram of one example of a production apparatus when the dissolution step is performed by the membrane dissolution and the pressure tank in the method of producing the heated ozone water of the embodiment.
Figure 6:
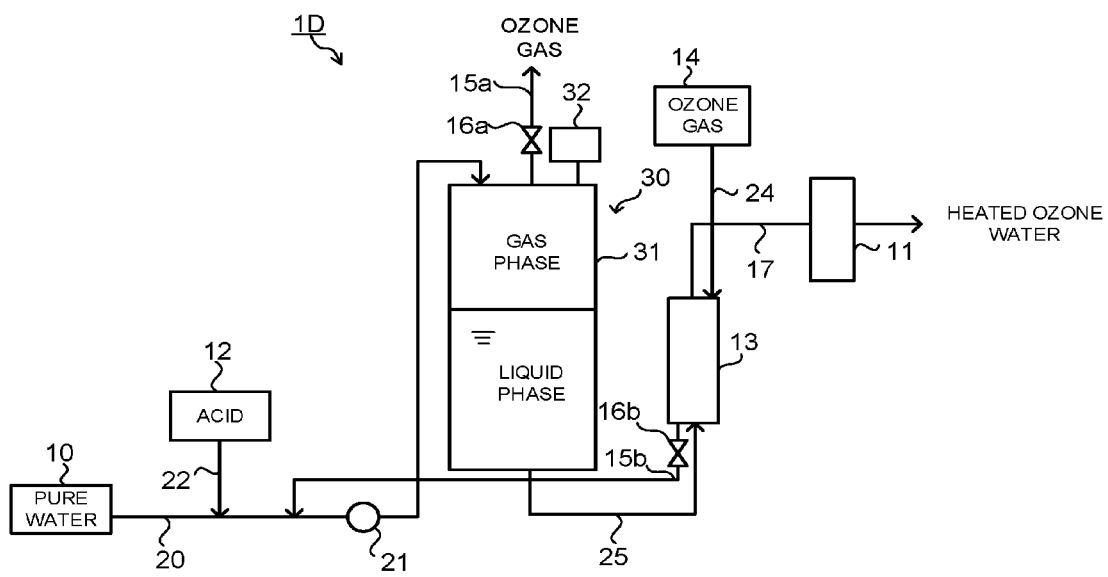
FIG. 6 is a schematic configuration diagram of another example of the production apparatus when the dissolution step is performed by the membrane dissolution and the pressure tank in the method of producing the heated ozone water of the embodiment.
Figure 7:
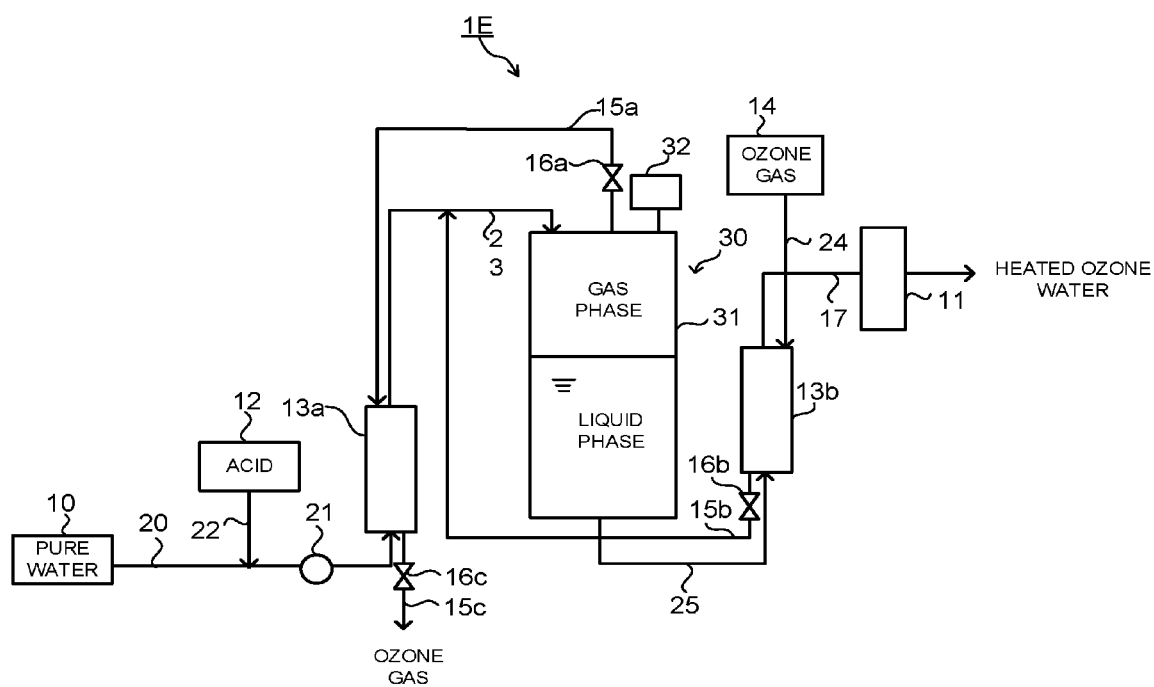
FIG. 7 is a schematic configuration diagram of still another example of the production apparatus when the dissolution step is performed by the membrane dissolution and the pressure tank in the method of producing the heated ozone water of the embodiment.

FIG. 4 is a schematic configuration diagram of a production apparatus 1B when the dissolution step is performed by a pressure tank in the method of producing the heated ozone water of the embodiment. FIG. 5 to FIG. 7 are schematic configuration diagrams 1C to 1E of respective production apparatuses when the dissolution step is performed by the membrane dissolution and the pressure tank in the method of producing the heated ozone water of the embodiment. When the dissolution step is performed by the pressure dissolution, the heating step is preferably performed after the dissolution step. The production apparatuses 1B to 1E are examples of apparatus of producing heated ozone water for producing the heated ozone water in the step order of (C) in FIG. 1. When the dissolution is performed by the pressure tank, a residence time of the ozone water in the pressure tank becomes significantly long, and the decomposition of ozone during this time cannot be ignored. Therefore, the heating step is preferably performed after the dissolution in the pressure tank. Note that in FIG. 2 to FIG. 7, the same configuration is denoted by the same reference numeral, and overlapped explanation of operations will be omitted.

The production apparatus 1A of the heated ozone water and the production apparatus 1A' of the heated ozone water illustrated in FIG. 2 and FIG. 3 include: a pure water supply unit 10 that supplies pure water; a heating device 11 that heats the pure water to 60° C. or more in the production apparatus 1A or heats the acid water to 60° C. or more in the production apparatus 1A'; an acid storage unit 12 that stores acid; an ozone supply unit 14 that generates or stores an ozone gas; and a membrane dissolution module 13 that dissolves the ozone gas in the heated pure water with a pH adjusted to 3 or less (heated acid water) to produce heated ozone water.

The production apparatus 1A of the heated ozone water has: a liquid pipe 20 that connects the pure water supply unit 10 and the membrane dissolution module 13, and through which liquid such as the pure water to be described below is flowed from the pure water supply unit 10 to the membrane dissolution module 13; and an acid supply pipe 22 whose one end is connected to the acid storage unit 12 and whose other end is connected in the middle of the liquid pipe 20, and the apparatus has the heating device 11 that heats the pure water on an upstream side of a portion of the liquid pipe 20 to which the acid supply pipe 22 is connected. There is provided a mechanism in which the pure water discharged from the pure water supply unit 10 is first heated by the heating device 11 to be heated pure water during when it passes through the inside of the liquid pipe 20, and subsequently, acid fed from the acid storage unit 12 via the acid supply pipe 22 is added to the heated pure water to produce heated acid water, and the heated acid water is supplied to the membrane dissolution module 13.

The production apparatus 1A' of the heated ozone water is the same as the production apparatus 1A of the heated ozone water except that a place of installing the heating device 11 is changed to a downstream side of a portion of the liquid pipe 20 to which the acid supply pipe 22 is connected. The production apparatus 1A' of the heated ozone water has a mechanism in which acid fed from the acid storage unit 12 via the acid supply pipe 22 is first added to the pure water discharged from the pure water supply unit 10 and flowed through the inside of the liquid pipe 20 to produce acid water, and subsequently, the acid water is heated by the heating device 11, and is supplied, as the heated acid water, to the membrane dissolution module 13. The following explanation regarding the production apparatus 1A of the heated ozone water can be applied to the production apparatus 1A' of the heated ozone water.

The production apparatus 1A of the heated ozone water has a gas pipe 24 that connects the ozone supply unit 14 and the membrane dissolution module 13, and has a mechanism in which the ozone gas is supplied to the membrane dissolution module 13 from the ozone supply unit 14 via the gas pipe 24.

An ozone water pipe 17 is connected to the membrane dissolution module 13, and has a mechanism in which the heated ozone water generated in the membrane dissolution module 13 is taken out from the production apparatus 1A of the heated ozone water. To the membrane dissolution module 13, an ozone gas discharge pipe 15 that discharges an excess ozone gas from the membrane dissolution module 13 is connected. Further, the ozone gas discharge pipe 15 has an ozone gas pressure regulating valve 16 for regulating a pressure of the ozone gas that is discharged from the membrane dissolution module 13.

In order to add acid to the pure water from the acid storage unit 12 via the acid supply pipe 22 to produce the acid water with the predetermined pH, the acid supply pipe 22 is provided with a measuring pump (not illustrated), for example. The acid with an amount of making the pH to be 3 or less, with respect to the pure water that flows through the liquid pipe 20, is measured by the measuring pump and supplied into the liquid pipe 20 from the acid supply pipe 22. The liquid flowing through the inside of the liquid pipe 20 is the pure water on the upstream side of the portion at which the acid supply pipe 22 is connected to the liquid pipe 20, and is the acid water on the downstream side of the portion. The liquid is heated on the upstream side or the downstream side, and is supplied, as the heated acid water, to the membrane dissolution module 13 connected to the most downstream side of the liquid pipe 20.

The liquid pipe 20 has a pump 21, and by the pump 21, a supply flow rate and a supply pressure of the acid water to be supplied to the membrane dissolution module 13 are adjusted. Note that it is also possible to design such that the pure water obtained by previously mixing the pure water and acid to adjust the pH of the pure water to 3 or less (acid water) is accommodated in a tank, and the acid water is supplied to the membrane dissolution module 13 from the tank, as heated acid water via a liquid pipe which is provided with a heating device.

As the ozone supply unit 14, it is possible to use a discharge ozone generator or an electrolytic ozone generator. The discharge ozone generator is also referred to as an ozonizer, and it applies a high-frequency high voltage between facing electrodes, to thereby generate an ozone gas from an oxygen gas through silent discharge between the electrodes. In the ozonizer, by controlling the oxygen gas supply amount, a generation amount of the ozone gas is controlled. The generated ozone gas is introduced into the membrane dissolution module 13 via the gas pipe 24.

In FIG. 2 and FIG. 3, regarding the membrane dissolution module 13, a cross section thereof is schematically illustrated. The membrane dissolution module 13 has a tubular gas permeable membrane 131, and an outer cylinder 132 housing the gas permeable membrane 131, and it is designed such that the heated acid water flows through the inside of the gas permeable membrane 131, and the ozone gas flows through a space between the gas permeable membrane 131 and the outer cylinder 132. The gas permeable membrane 131 has gas permeability, the ozone gas that flows on the outside of the gas permeable membrane 131 permeates the gas permeable membrane 131 and is supplied to and dissolved in the heated acid water that flows through the inside of the gas permeable membrane 131, resulting in that heated ozone water is produced. In the following explanation related to the production apparatus 1A of the heated ozone water and the production apparatus 1A' of the heated ozone water, when the liquid that flows through the inside of the membrane dissolution module 13 is referred to as "acid water", the acid water indicates heated acid water.

As the gas permeable membrane, for example, one whose material is polytetrafluoroethylene (PTFE), polyvinylidene fluoride (PVDF), polysulfone, or the like is used, and among the above, the gas permeable membrane is preferably a membrane formed of a fluorine-based material such as PTFE or PVDF. By using the membrane formed of the fluorine-based material, it can be considered that generation of bubbles of the ozone gas inside the membrane dissolution module 13 is suppressed, and consequently, high-concentration heated ozone water is likely to be obtained, and the reduction in the ozone concentration of the obtained heated ozone water is also likely to be suppressed. Further, by using the membrane formed of the fluorine-based material, it is possible to supply the heated ozone water in a stable manner for a long period of time without causing deterioration of the membrane due to ozone.

In FIG. 2 and FIG. 3, a simplified configuration of the membrane dissolution module 13 is illustrated as one example, and a shape and an arrangement of the gas permeable membrane and the outer cylinder are not limited to this. In order to obtain a large membrane area with small capacity, it is also possible to employ, for example, a configuration in which a plurality of tubular gas permeable membranes are arranged in the outer cylinder, or a configuration in which a tubular gas permeable membrane is spirally wound and housed in the outer cylinder.

In FIG. 2 and FIG. 3, a direction of the acid water that flows through the inside of the gas permeable membrane 131 is indicated by a solid arrow mark, and a direction of the ozone gas that flows through the outside of the gas permeable membrane 131 is indicated by a dotted arrow mark. In this case, the flowing direction of the acid water and the flowing direction of the ozone gas are directions which are opposed to each other. In order to efficiently dissolve the ozone gas in the acid water, it is preferable to make the flowing direction of the acid water and the flowing direction of the ozone gas to be opposed to each other. However, it is also possible to make the flowing direction of the acid water and the flowing direction of the ozone gas to be the same direction, according to need. Further, in FIG. 2 and FIG. 3, the acid water flows through the inside of the tubular gas permeable membrane 131, and the ozone gas is flowed through the space between the gas permeable membrane 131 and the outer cylinder 132, but, it is also possible to design such that the ozone gas flows through the inside of the gas permeable membrane 131, and the acid water flows between the gas permeable membrane 131 and the outer cylinder 132.

A ratio of the supply amounts of the acid water and the ozone gas which are supplied to the membrane dissolution module 13, is as described above. Note that in the case of the membrane dissolution module 13, the ratio of the supply amounts of the acid water and the ozone gas is expressed by a ratio of supply flow rates of the both, namely, a volume ratio of the acid water (L/min):the ozone gas (NL/min). Note that the unit "NL" indicates a volume of gas expressed in terms of a standard state.

The supply flow rate of the acid water in the membrane dissolution module 13 is preferably 0.5 L/min to 40 L/min, in the respect that heated ozone water whose ozone concentration is close to the saturated dissolution concentration can be generated. Further, the supply pressure of the acid water with respect to the membrane dissolution module 13 is preferably 0.1 MPa to 0.7 MPa.

The supply flow rate of the ozone gas in the membrane dissolution module 13 is preferably 0.25 NL/min to 800 NL/min, in the respect that the heated ozone water whose ozone concentration is close to the saturated dissolution concentration can be generated. Further, the supply pressure of the ozone gas with respect to the membrane dissolution module 13 is preferably 0.02 MPa to 0.695 MPa.

Further, it is more preferable that a difference between the supply pressure of the acid water and the supply pressure of the ozone gas (the supply pressure of the acid water—the supply pressure of the ozone gas) is 0.005 MPa to 0.2 MPa, and it is still more preferable that the difference is 0.01 to 0.05 MPa. Consequently, it is possible to obtain the heated ozone water whose ozone concentration is extremely close to the saturated dissolution concentration, and in addition to that, it is possible to suppress the reduction in the ozone concentration caused by the generation of bubbles, and the like.

An excess ozone gas which is not mixed in the acid water in the membrane dissolution module 13, is discharged via the ozone gas discharge pipe 15. At this time, by regulating an opening degree of the ozone gas pressure regulating valve 16, it is possible to regulate a discharge amount of the ozone gas discharged from the membrane dissolution module 13, to thereby regulate the flow rate and the pressure of the ozone gas inside the membrane dissolution module 13.

In a manner as described above, the heated ozone water is produced in the membrane dissolution module 13, and is taken out from the production apparatus 1A of the heated ozone water via the ozone water pipe 17. It is preferable that an inner surface of the ozone water pipe 17 is treated with resin excellent in resistance to ozone and the like, such as, for example, a fluorocarbon resin such as a copolymer of tetrafluoroethylene and perfluoroalkoxyethylene (PFA), a copolymer of tetrafluoroethylene and hexafluoropropylene (FEP), or PTFE. This makes it possible to suppress the generation of bubbles of the ozone gas from the heated ozone water inside the ozone water pipe 17, to thereby suppress the reduction in the ozone concentration in the heated ozone water. Further, it is possible to suppress corrosion of the ozone water pipe 17, caused by ozone. Note that based on similar reasons, the pipes through which the ozone gas flows, are preferably treated with the fluorocarbon resin.

In order to suppress the reduction in the ozone concentration of the heated ozone water, an inside diameter ϕ of the ozone water pipe 17 is preferably set to one by which a residence time from a heated ozone water discharge port of the membrane dissolution module 13 to a place where the heated ozone water is used, becomes six seconds or less. When the residence time is six seconds or less, it is possible to suppress generation of bubbles of the ozone gas from the heated ozone water inside the ozone water pipe 17, which makes it possible to suppress the reduction in the ozone concentration. Further, in order to suppress the reduction in the ozone concentration at the place where the heated ozone water is used, a length of piping route from the heated ozone water discharge port of the membrane dissolution module 13 to the place where the heated ozone water is used, is preferably short, and is preferably 5 m or less, for example.

Note that in the production apparatus 1A of the heated ozone water and the production apparatus 1A' of the heated ozone water, it is preferable to design such that a temperature of the liquid heated to 60° C. or more by the heating device 11, can be maintained to the finally-obtained heated ozone water.

The production apparatus 1B of heated ozone water illustrated in FIG. 4 includes: the pure water supply unit 10 that supplies pure water; the acid storage unit 12 that stores acid; the ozone supply unit 14 that generates or stores an ozone gas; a pressure tank 30 that dissolves the ozone gas in the pure water with a pH adjusted to 3 or less (acid water) to generate ozone water; and the heating device 11 that heats the generated ozone water to 60° C. or more.

The production apparatus 1B of the heated ozone water is different from the production apparatus 1A of the heated ozone water in a point that the device for performing the dissolution step is replaced to the pressure tank 30 from the membrane dissolution module 13, and a point that a place of installing the heating device 11 is changed to the ozone water pipe 17 from the liquid pipe 20. Accordingly, the acid water which is supplied to the pressure tank 30 in the production apparatus 1B of the heated ozone water, is unheated acid water without being heated, although the acid water which is supplied to the membrane dissolution module 13 in the production apparatus 1A of the heated ozone water is heated. Further, in the production apparatus 1A of the heated ozone water, the (heated) acid water and the ozone gas are separately supplied to the membrane dissolution module 13, but, in the production apparatus 1B of the heated ozone water, the (unheated) acid water and the ozone gas are mixed, and then supplied to the pressure tank 30, which is a different point between the apparatuses.

In the production apparatus 1B of the heated ozone water, the liquid pipe 20 does not have the heating device 11, and the gas pipe 24 through which the ozone gas from the ozone supply unit 14 flows, is connected on the downstream side of the portion of the liquid pipe 20 to which the acid supply pipe 22 is connected. The acid water flows on the upstream side of the portion of the liquid pipe 20 to which the gas pipe 24 is connected, and the mixed water obtained by supplying the ozone gas to the acid water, flows on the downstream side of the portion, and the mixed water is supplied to the pressure tank 30 which is connected to the most downstream side of the liquid pipe 20. A supply amount of the mixed water with respect to the pressure tank 30 is adjusted by the pump 21 that is provided to the liquid pipe 20.

The pressure tank 30 has a tank 31 that accommodates the mixed water supplied via the liquid pipe 20, and a pressure means 32 that performs pressurization to set a pressure in the tank 31 to a predetermined pressure, and by pressurizing the mixed water in the tank 31, the ozone water having the predetermined concentration with the saturated dissolution concentration set as an index, is produced. The tank 31 is connected, at an upper portion thereof, to the ozone gas discharge pipe 15 having the ozone gas pressure regulating valve 16, and is connected, at a bottom portion thereof, to the ozone water pipe 17. The ozone water pipe 17 has the heating device 11, and the ozone water discharged from the pressure tank is heated to 60° C. or more and is taken out, as the heated ozone water, from the production apparatus 1B of the heated ozone water.

A ratio of the supply amounts of the acid water and the ozone gas which are supplied to the pressure tank 30, is as described above. Note that in the production apparatus 1B of the heated ozone water, the ratio of the supply amounts of the acid water and the ozone gas which are supplied to the pressure tank 30, means a ratio of the supply amounts of the acid water and the ozone gas in the mixed water. The ratio of the supply amounts of the acid water and the ozone gas in the mixed water is expressed by a volume ratio of a supply flow rate (L/min) of the acid water on the upstream side of the portion of the liquid pipe 20 to which the gas pipe 24 is connected and a supply flow rate (NL/min) of the ozone gas supplied to the liquid pipe 20 from the ozone supply unit 14 via the gas pipe 24. Note that the supply flow rate of the ozone gas is adjusted by a valve (not illustrated) which is provided to the gas pipe 24.

In the production apparatus 1B of the heated ozone water, the supply flow rate of the acid water is preferably 0.5 L/min to 40 L/min, and the supply flow rate of the ozone gas is preferably 0.25 NL/min to 800 NL/min, in the respect that the ozone water whose ozone concentration is close to the saturated dissolution concentration can be generated.

The pressure for pressurizing the mixed water in the tank 31 is preferably 0.05 MPa to 1 MPa, and more preferably 0.4 MPa to 0.6 MPa, in the respect that the ozone water whose ozone concentration is close to the saturated dissolution concentration can be generated.

Note that it is also possible to configure a circulating pressure tank in a manner that, before the concentration of the ozone water reaches the targeted ozone concentration in the tank 31, the ozone water whose ozone concentration is lower than the targeted ozone concentration is extracted from the tank 31 and is mixed to the flow on the downstream side of the portion of the liquid pipe 20 to which the gas pipe 24 is connected. By employing the circulating pressure tank, a period of time required for obtaining the ozone water with the targeted concentration is reduced, resulting in that the productivity is improved.

Here, if the other conditions are the same, the higher the liquid temperature of the ozone water, the lower the saturated dissolution concentration of the ozone water. For this reason, the ozone concentration of the heated ozone water whose temperature is increased to 60° C. or more becomes lower than the ozone concentration of the ozone water at room temperature obtained in the pressure tank, but, the ratio of the ozone concentration in that state with respect to the saturated dissolution concentration is substantially maintained. Therefore, by obtaining, in the pressure tank, the ozone water whose ozone concentration is close to the saturated dissolution concentration at the temperature after the heating, and by heating the ozone water, the heated ozone water whose ozone concentration is close to the saturated dissolution concentration is obtained. In a manner as described above, when the heated ozone water is used for cleaning an article, particularly, for cleaning a semiconductor wafer, the cleaning performance is enhanced by suppressing the generation of bubbles during the cleaning. Besides, the amount of ozone used can be suppressed to the very minimum.

Next, respective production apparatuses 1C to 1E of heated ozone water when the dissolution step is performed by the membrane dissolution and the pressure tank in the method of producing the heated ozone water of the embodiment, will be described by using FIG. 5 to FIG. 7.

The production apparatus 1C of the heated ozone water illustrated in FIG. 5 has a configuration in which a first stage of the dissolution step is performed by the membrane dissolution module 13, a second stage of the dissolution step is then performed by the pressure tank 30, and the ozone water taken out from the pressure tank 30 is heated to 60° C. or more by the heating device 11, to thereby produce heated ozone water being a final product.

In the production apparatus 1C of the heated ozone water, the pure water supply unit 10 and the membrane dissolution module 13 are connected, and the liquid pipe 20 through which the pure water or the like passes from the pure water supply unit 10 to the membrane dissolution module 13 is similar to the liquid pipe 20 of the production apparatus 1A of the heated ozone water except that it does not have the heating device 11. Therefore, although the heated acid water is supplied to the membrane dissolution module 13 in the production apparatus 1A of the heated ozone water, in the production apparatus 1C of the heated ozone water, unheated acid water is supplied to the membrane dissolution module 13, and the ozone gas is dissolved in the acid water by the membrane dissolution module 13.

From the membrane dissolution module 13, primary ozone water is discharged, the ozone water is supplied to the pressure tank 30 via a liquid pipe 23, and subjected to pressure treatment in the pressure tank 30, to thereby obtain secondary ozone water. The secondary ozone water is discharged from the ozone water pipe 17 that is connected to the bottom portion of the tank 31 of the pressure tank 30. The ozone water pipe 17 has the heating device 11, and the secondary ozone water discharged from the pressure tank 30 is heated to 60° C. or more, and taken out, as the heated ozone water, from the production apparatus 1C of the heated ozone water.

Here, in the production apparatus 1C of the heated ozone water, each of the primary ozone water and the secondary ozone water is the ozone water at room temperature. It is designed such that, at room temperature, the primary ozone water whose ozone concentration is lower than that of the secondary ozone water having the targeted concentration, is obtained by the membrane dissolution module 13, and by the pressure tank 30, the primary ozone water is turned into the secondary ozone water having the predetermined concentration with the saturated dissolution concentration at the temperature after the heating set as an index. Further, similarly to the production apparatus 1B of the heated ozone water, also in the production apparatus 1C of the heated ozone water, by obtaining, in the pressure tank 30, the secondary ozone water whose ozone concentration is close to the saturated dissolution concentration after the heating, and by heating the ozone water, it is possible to obtain the heated ozone water whose ozone concentration is close to the saturated dissolution concentration.

In the production apparatus 1C of the heated ozone water, the ozone gas supplied from the ozone supply unit 14 is introduced into the liquid pipe 23 via the gas pipe 24, on the downstream side of the membrane dissolution module 13. Further, an excess ozone gas discharged from the tank 31 is supplied to the membrane dissolution module 13 via an ozone gas discharge pipe 15a having an ozone gas pressure regulating valve 16a. Besides, it is configured such that an excess ozone gas discharged from the membrane dissolution module 13 is discharged to the outside of the production apparatus 1C of the heated ozone water via an ozone gas discharge pipe 15b having an ozone gas pressure regulating valve 16b. In the production apparatus 1C of the heated ozone water, by employing the above-described configuration regarding the supply and the discharge of the ozone gas, it is possible to efficiently use the ozone gas.

The production apparatus 1D of the heated ozone water illustrated in FIG. 6 has a configuration in which a first stage of the dissolution step is performed by the pressure tank 30, a second stage of the dissolution step is then performed by the membrane dissolution module 13, and the ozone water taken out from the membrane dissolution module 13 is heated to 60° C. or more by the heating device 11, to thereby produce heated ozone water being a final product.

In the production apparatus 1D of the heated ozone water, the mixed water of the acid water and the ozone gas is supplied to the pressure tank 30, and the ozone gas is dissolved in the acid water in the pressure tank 30, in a similar manner to the production apparatus 1B of the heated ozone water. From the pressure tank 30, primary ozone water is discharged, the ozone water is supplied to the membrane dissolution module 13 via a liquid pipe 25, and the ozone gas is further dissolved in the membrane dissolution module 13, to thereby obtain secondary ozone water. The secondary ozone water is discharged from the ozone water pipe 17 that is connected to the membrane dissolution module 13. The ozone water pipe 17 has the heating device 11, and the secondary ozone water discharged from the membrane dissolution module 13 is heated to 60° C. or more and is taken out, as the heated ozone water, from the production apparatus 1D of the heated ozone water.

In the production apparatus 1D of the heated ozone water, each of the primary ozone water and the secondary ozone water is the ozone water at room temperature, similarly to the production apparatus 1C of the heated ozone water. It is designed such that, at room temperature, the primary ozone water whose ozone concentration is lower than that of the secondary ozone water having the targeted concentration, is obtained by the pressure tank 30, and by the membrane dissolution module 13, the primary ozone water is turned into the secondary ozone water having the predetermined concentration with the saturated dissolution concentration at the temperature after the heating set as an index. Further, similarly to the above, also in the production apparatus 1D of the heated ozone water, by obtaining, in the membrane dissolution module 13, the secondary ozone water whose ozone concentration is close to the saturated dissolution concentration at the temperature after the heating, and by heating the ozone water, it is possible to obtain the heated ozone water whose ozone concentration is close to the saturated dissolution concentration.

In the production apparatus 1D of the heated ozone water, the ozone gas supplied from the ozone supply unit 14 is introduced into the membrane dissolution module 13 via the gas pipe 24, similarly to the production apparatus 1A of the heated ozone water. An excess ozone gas discharged from the membrane dissolution module 13 is supplied to the acid water on the downstream side of the portion of the liquid pipe 20 to which the acid supply pipe 22 is connected, via the ozone gas discharge pipe 15b having the ozone gas pressure regulating valve 16b, to thereby produce mixed water. Further, the mixed water is supplied to the tank 31 of the pressure tank 30. The tank 31 is configured such that it is connected, at an upper portion thereof, to the ozone gas discharge pipe 15a having the ozone gas pressure regulating valve 16a, and it discharges the excess ozone gas to the outside of the production apparatus 1D of the heated ozone water. In the production apparatus 1D of the heated ozone water, by employing the above-described configuration regarding the supply and the discharge of the ozone gas, it is possible to efficiently use the ozone gas.

The production apparatus 1E of the heated ozone water illustrated in FIG. 7 has a configuration in which a first stage of the dissolution step is performed by a membrane dissolution module 13a, a second stage of the dissolution step is then performed by the pressure tank 30, a third stage of the dissolution step is lastly performed by a membrane dissolution module 13b, and the ozone water taken out from the membrane dissolution module 13b is heated to 60° C. or more by the heating device 11, to thereby produce heated ozone water being a final product.

In the production apparatus 1E of the heated ozone water, primary ozone water is discharged from the membrane dissolution module 13a, the ozone water is supplied to the pressure tank 30 via the liquid pipe 23, and subjected to pressure treatment in the pressure tank 30, to thereby obtain secondary ozone water. The secondary ozone water is further treated in the membrane dissolution module 13b to be turned into tertiary ozone water, and discharged from the ozone water pipe 17 that is connected to the membrane dissolution module 13b. The ozone water pipe 17 has the heating device 11, and the tertiary ozone water discharged from the membrane dissolution module 13b is heated to 60° C. or more, and taken out, as the heated ozone water, from the production apparatus 1E of the heated ozone water.

In the production apparatus 1E of the heated ozone water, each of the primary ozone water, the secondary ozone water, and the tertiary ozone water is the ozone water at room temperature, similarly to the above. It is designed such that, at room temperature, the primary ozone water and the secondary ozone water whose ozone concentration is lower than that of the tertiary ozone water having the targeted concentration, are obtained by the membrane dissolution module 13a and the pressure tank 30, respectively, in this order, and by the membrane dissolution module 13b, the tertiary ozone water having the predetermined concentration with the saturated dissolution concentration at the temperature after the heating set as an index, is obtained. Further, similarly to the above, also in the production apparatus 1E of the heated ozone water, by obtaining, in the membrane dissolution module 13b, the tertiary ozone water whose ozone concentration is close to the saturated dissolution concentration at the temperature after the heating, and by heating the ozone water, it is possible to obtain the heated ozone water whose ozone concentration is close to the saturated dissolution concentration.

In the production apparatus 1E of the heated ozone water, it is configured such that the ozone gas supplied from the ozone supply unit 14 flows through the membrane dissolution module 13b, the pressure tank 30, and the membrane dissolution module 13a in this order, and an excess ozone gas discharged from the membrane dissolution module 13a is discharged to the outside of the production apparatus 1E of the heated ozone water via an ozone gas discharge pipe 15c having an ozone gas pressure regulating valve 16c. In the production apparatus 1E of the heated ozone water, by employing the above-described configuration regarding the supply and the discharge of the ozone gas, it is possible to efficiently use the ozone gas.

In the method of producing the heated ozone water of the present embodiment described above, the ozone concentration of the obtained heated ozone water can be increased by setting the saturated dissolution concentration of ozone in the heated ozone water as an index. For example, the ozone concentration in the obtained heated ozone water can be set to 70% or more of the saturated dissolution concentration. The closer the ozone concentration of the heated ozone water is to the saturated dissolution concentration, the more preferable it is, and the ozone concentration of the heated ozone water is preferably 75% or more, more preferably 80% or more, and still more preferably 85% or more of the saturated dissolution concentration. Further, the obtained heated ozone water can stably maintain the ozone concentration. Specifically, even if the temperature of the heated ozone water is 60° C. or more, the reduction in the ozone concentration can be suppressed significantly.

Although an absolute value of the ozone concentration is different depending on the conditions for producing the heated ozone water, according to the method of producing the heated ozone water of the present embodiment, it is possible to obtain extremely high-concentration heated ozone water whose ozone concentration is 200 mg/L or more, preferably 230 mg/L or more, and more preferably 250 mg/L or more at a liquid temperature of 60° C. Besides, even at a liquid temperature of 80° C., for example, it is possible to obtain extremely high-concentration heated ozone water whose ozone concentration is 150 mg/L or more, and preferably 160 mg/L or more.

[Heated Ozone Water and Semiconductor Wafer-Cleaning Liquid]

Heated ozone water of an embodiment of the present invention is heated ozone water including heated pure water in which ozone is dissolved, and is characterized in that a pH of the heated ozone water is 3 or less, a temperature of the heated ozone water is 60° C. or more, and an ozone concentration of the heated ozone water is expressed by the following equation (3).

$$\text{Ozone concentration [mg/L]} \geq 350 - 2.5 \times \text{liquid temperature of ozone water [° C.]} \qquad (3)$$

For example, at a liquid temperature of 60° C., the ozone concentration of the heated ozone water is 200 mg/L or more, preferably 230 mg/L or more, and more preferably 250 mg/L or more. Further, for example, at a liquid temperature of 80° C., the ozone concentration of the heated ozone water is 150 mg/L or more, and preferably 160 mg/L or more.

The pH of the heated ozone water of the embodiment is preferably 2.5 or less, and is preferably 1 or more. The liquid temperature of the heated ozone water of the embodiment is preferably 70° C. or more, and more preferably 80° C. or more. From a viewpoint of suppressing the reduction in the ozone concentration of the heated ozone water, the liquid temperature is preferably 90° C. or less, and more preferably 85° C. or less.

The heated ozone water of the embodiment contains acid in order to set the pH to 3 or less. As the acid, similar acid as described above can be cited, and it is preferable to use one kind or more selected from a hydrochloric acid, an acetic acid, and a citric acid. Note that when an organic acid is used as the acid, the pH is preferably 1.5 or more, and more preferably 1.7 or more, from a viewpoint that decomposition of the organic acid is likely to occur and thus high-concentration heated ozone water becomes difficult to be obtained.

The heated ozone water of the present embodiment is, for example, heated ozone water having the above-described characteristics and obtained by the method of producing the heated ozone water of the present embodiment.

This heated ozone water can be used as a so-called semiconductor wafer-cleaning liquid for initial cleaning or post-cleaning of chemical mechanical polishing (CMP) of a semiconductor wafer in a semiconductor manufacturing process. As an object to be cleaned, metal, an organic matter such as a resist, or the like, can be cited.

As described above, the heated ozone water of the present embodiment can adjust the ozone concentration to an extremely high concentration even after being heated to 60° C. or more, and besides, the reduction in the ozone concentration is suppressed significantly, so that the heated ozone water can be favorably used also as a resist stripping liquid for stripping a resist. The resist to be stripped by the heated ozone water is not particularly limited, and is a resist of novolac type, chemically amplified type, or electron beam type (PMMA type), or the like.

Further, the heated ozone water obtained by the present embodiment causes extremely small reduction in the ozone concentration even after being heated to 60° C. or more, so that it can also be applied to any method of so-called single-wafer cleaning in which the heated ozone water is poured on a substrate to perform cleaning, and batch cleaning in which a substrate is immersed in a cleaning bath accommodating the heated ozone water. Besides, when performing the single-wafer cleaning on the substrate by using the heated ozone water of the embodiment, by using a method such that the substrate is heated, for example, it is possible to perform more effective cleaning by suppressing the reduction in temperature of the heated ozone water during the cleaning.

EXAMPLES

Next, examples will be described. The present invention is not limited to the following examples.

Experimental Examples 1 to 3

A production apparatus 1A of heated ozone water similar to one illustrated in FIG. 2 was used, and under the following temperature conditions, the following acids were used to adjust a pH, to thereby produce temperature-adjusted ozone water, and a relation between the pH of the obtained ozone water and an ozone concentration was examined at each temperature. Results are shown in FIG. 8.

(Temperature Conditions and Kinds of Acid)

Figure 8:
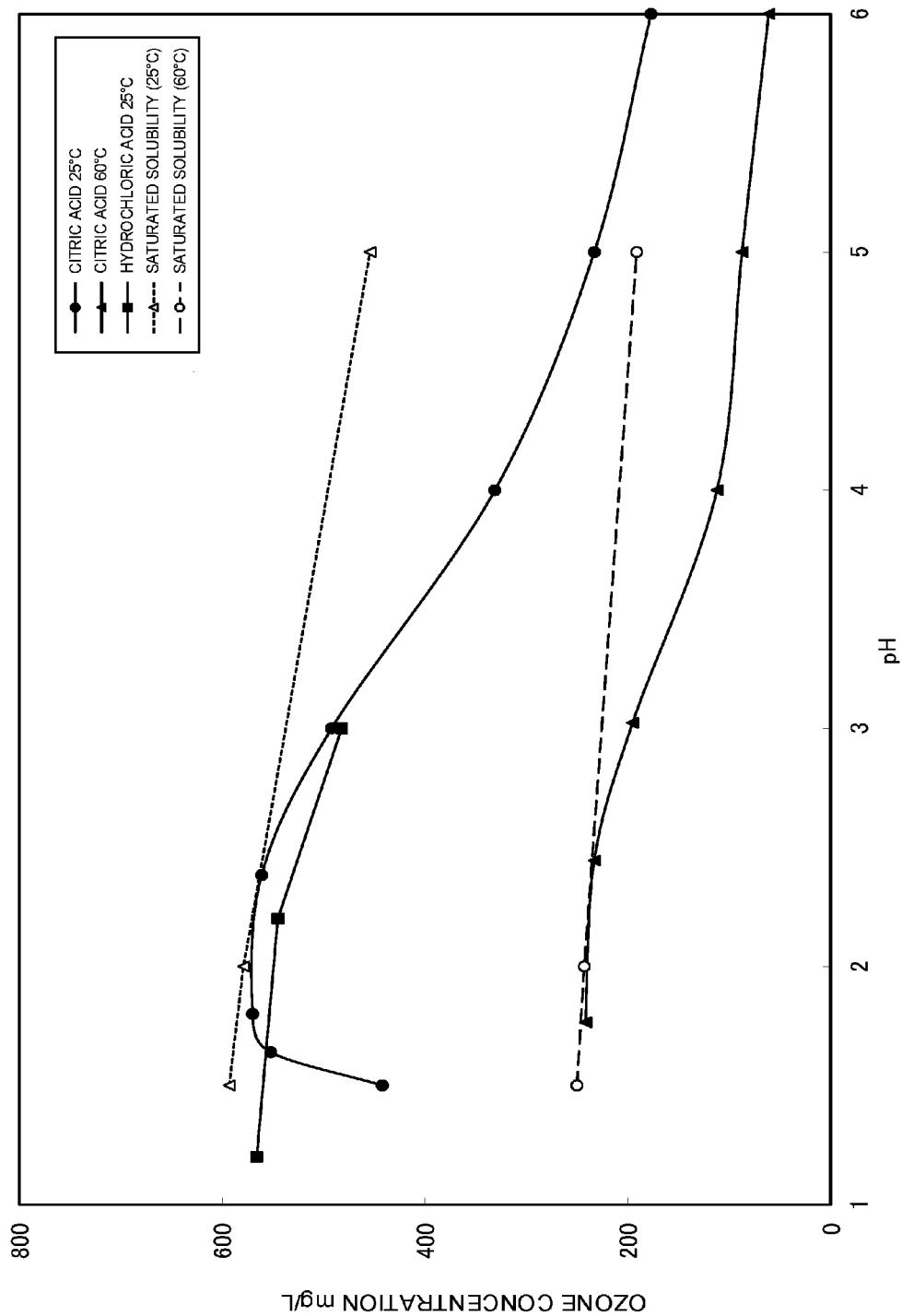
FIG. 8 is a graph illustrating a relation among a temperature of ozone water, a pH, and an ozone concentration in examples.

Experimental example 1; liquid temperature of 25° C., citric acid (the result is shown by plotting ● in FIG. 8.)
Experimental example 2; liquid temperature of 25° C., hydrochloric acid (the result is shown by plotting ■ in FIG. 8.)
Experimental example 3; liquid temperature of 60° C., citric acid (the result is shown by plotting ▲ in FIG. 8.)

The specification of the used production apparatus and the production conditions were as follows.

(Specification of Production Apparatus)

Liquid pipe 20; inside diameter φ of 4.35 mm
Ozone water pipe 17; inside diameter φ of 4.35 mm, length of 3 m
Heating device: NOMUREXON NOM-5-150-S heating device manufactured by Nomura Micro Science Co., Ltd.
Supply of acid; a predetermined amount of acid was measured and poured by using a measuring pump (PXM-12-VFC-HW manufactured by TACMINA CORPORATION) to perform adjustment to achieve a predetermined pH.

Membrane dissolution module 13; dissolve ozonation module GNF-01E manufactured by Japan Gore-Tex Inc.
Ozone supply unit 14; OG-125H-R manufactured by TOSHIBA MITSUBISHI-ELECTRIC INDUSTRIAL SYSTEMS CORPORATION (Production Conditions)

Quality of pure water; resistivity of 18 MΩ·cm or more, TOC (total organic carbon concentration) of 1 μg/L or less
Ozone gas; supply flow rate of 3 NL/min, supply pressure of 0.28 MPa, ozone gas concentration of 380 g/m$^3$
Acid water; supply flow rate of 1 L/min, supply pressure of 0.3 MPa The ozone concentration in the obtained ozone water was subjected to on-line measurement by using a concentration meter which was self-produced by using an absorption ozone concentration meter CZ-100 manufactured by HORIBA, Ltd., and USB4000 manufactured by Ocean Optics, Inc. as a spectroscope.

In FIG. 8, a relation between the pH and the saturated dissolution concentration when the liquid temperature is 25° C. (dotted line) and a relation between the pH and the saturated dissolution concentration when the liquid temperature is 60° C. (dashed line) in the aforementioned condition, are collectively illustrated. From FIG. 8, it can be understood that, under the above-described condition, it is possible to obtain the ozone water whose ozone concentration is increased to approximately 70% or more of the saturated dissolution concentration, at the pH of 3 or less, regardless of the temperature and the kinds of acid.

Note that in the pressure tank, normally, the dissolution step is performed at room temperature in the vicinity of 25° C., and then the obtained ozone water is heated to 60° C. or more, to thereby obtain the heated ozone water. From FIG. 8, it can be understood that, regarding the ozone water produced under the condition that the pH is 3 or less, the ratio with respect to the saturated dissolution concentration at 25° C. and the ratio with respect to the saturated dissolution concentration at 60° C. are not greatly different from each other. Therefore, even in a case where, in the pressure tank, the dissolution step is performed at room temperature in the vicinity of 25° C., and then the obtained ozone water is heated to 60° C. or more to obtain the heated ozone water, it can be considered that a result similar to the result at 60° C. in the membrane dissolution module illustrated in FIG. 8 is obtained.

Examples 1 to 11

A production apparatus similar to that used in the experimental examples 1 to 3 was used to produce ozone water under production conditions shown in Table 1. Table 1 shows results obtained by measuring ozone concentrations of the obtained ozone water, saturated dissolution concentrations at respective conditions, and ratios of the ozone concentrations of the obtained ozone water to the saturated dissolution concentrations in percent figures (%). The example 3 to the example 9 are working examples, and the examples 1, 2, 10, 11 are comparative examples. Regarding the ozone water obtained in each of the examples, a resist cleaning performance and a retention property of the ozone concentration were evaluated based on the following methods. Note that the ozone water obtained in each of the working examples is heated ozone water having a pH of 3 or less and a temperature of 60° C. or more.

(Resist Stripping Test (Cleaning Performance))

A resist stripping test was performed by using the ozone water obtained as described above. In this test, a sample (having a size of 2 cm×2 cm) obtained by ion-implanting, with the use of an $AsH_3$ gas, As (arsenic) by $1\times10^{15}$ pieces/cm$^2$ into an eight-inch silicon wafer to which a resist was adhered in a pattern shape (the kind of the resist: TDUR-P3116EM 15cp manufactured by TOKYO OHKA KOGYO CO., LTD., thickness: 380 nm), was cleaned. The sample was housed in a glass beaker, and the sample was cleaned by pouring the ozone water thereon at a flow rate of 1 L/min. The cleaned sample was rinsed by ultrapure water, and after that, a resist stripping state on a surface of the sample was observed with an optical microscope and evaluated as follows. Results are shown in Table L Note that a cleaning time was set to four minutes at the longest, and regarding the sample evaluated as "A" before the lapse of four minutes, the time at which the evaluation was obtained was indicated as the cleaning time in Table 1.

machine, it is preferable that the situation of A is realized within three minutes, and more preferably within two minutes.

(Observation of Bubble Amount)

The ozone water produced in each of the above-described examples was accommodated in a glass beaker of 300 ml and left to stand for five minutes, and after that, a state in the beaker was observed. If the generated bubble amount is small, it can be evaluated that the reduction in the ozone concentration is suppressed, and thus the ozone concentration is favorably retained.

A: Some bubbles were adhered to the beaker (several tens of bubbles on the entire wall surface).

B: Bubbles whose amount was larger than that of A were adhered (the number being about the double the number of A, when visually observed).

C: Bubbles whose amount was larger than that of B were adhered (the number being about the double the number of B or more, when visually observed).

TABLE 1

| | | | | Production condition | | | | | | | Physical property | | | Evaluation | | |
|---|---|---|---|---|---|---|---|---|---|---|---|---|---|---|---|---|
| | | | | Ozone gas | | | Acid water | | Supply amount ratio between gas and acid water (FG/FL) | Supply difference between gas and acid water (PL-PG) | Ozone concentration (mg/L) | Saturated dissolution of ozone (mg/L) | Ratio with respect to saturation (%) | Evaluation of cleaning performance | | |
| | Temperature (°C) | pH | Acid | Concentration (g/m$^3$) | Supply flow rate FG (NL/min) | Supply pressure PG (MPa) | Supply flow rate FL (L/min) | Supply pressure PL (MPa) | | | | | | Cleaning time (minute) | Cleaning Performance | Bubble amount |
| Ex. 1 | 20 | 2.8 | Citric acid | 380 | 2 | 0.38 | 1 | 0.4 | 2 | 0.02 | 550 | 645 | 85 | 4 | B | A |
| Ex. 2 | 20 | 2.8 | Hydrochloric acid | | 2 | 0.38 | 1 | 0.4 | 2 | 0.02 | 530 | 645 | 82 | 4 | B | A |
| Ex. 3 | 60 | 2.0 | Citric acid | | 0.9 | 0.38 | 1 | 0.4 | 0.9 | 0.02 | 220 | 289 | 76 | 1.5 | A | A |
| Ex. 4 | 60 | 2.0 | Hydrochloric acid | | 0.9 | 0.38 | 1 | 0.4 | 0.9 | 0.02 | 210 | 289 | 73 | 1.5 | A | A |
| Ex. 5 | 60 | 2.8 | Citric acid | | 0.9 | 0.38 | 1 | 0.4 | 0.9 | 0.02 | 205 | 271 | 76 | 1.5 | A | A |
| Ex. 6 | 80 | 2.0 | Citric acid | | 0.7 | 0.38 | 1 | 0.4 | 0.7 | 0.02 | 162 | 203 | 80 | 1 | A | A |
| Ex. 7 | 80 | 2.0 | Hydrochloric acid | | 0.7 | 0.38 | 1 | 0.4 | 0.7 | 0.02 | 150 | 203 | 74 | 1 | A | A |
| Ex. 8 | 80 | 2.8 | Citric acid | | 0.7 | 0.38 | 1 | 0.4 | 0.7 | 0.02 | 158 | 190 | 83 | 1 | A | A |
| Ex. 9 | 60 | 2.8 | Citric acid | | 0.4 | 0.38 | 1 | 0.4 | 0.4 | 0.02 | 102 | 271 | 38 | 4 | A | A |
| Ex. 10 | 20 | 2.8 | Citric acid | | 0.7 | 0.38 | 1 | 0.4 | 0.7 | 0.02 | 195 | 645 | 30 | 4 | C | A |
| Ex. 11 | 20 | 4.5 | Citric acid | | 2 | 0.38 | 1 | 0.4 | 2 | 0.02 | 95 | 562 | 17 | 4 | C | C |

A: All of the resist was stripped.

B: Although the resist was stripped, it was partially remained.

C: The resist was not stripped.

Note that, from the above-described test results, when stripping a resist which is practically used industrially, by using the above-described ozone water according to operating conditions of an industrial resist-stripping actual As shown in Table 1, it was confirmed that regarding the heated ozone water obtained in each of the working examples (the examples 3 to 9), the ratio of the ozone concentration to the saturated dissolution concentration was high, and besides, the bubble amount was smaller than that of the example 11 being the comparative example, and thus the amount of ozone reduced as bubbles was small when performing the resist stripping. The ozone water in each of the examples 1, 2, 10 being the comparative examples had a low liquid temperature, and thus was inferior in terms of the resist stripping performance. It can be understood that the heated ozone water obtained in each of the working examples is excellent in the resist stripping performance, and the heated ozone water whose ion concentration is 70% or more of the saturated dissolution concentration requires a short cleaning time.

Examples 12 to 14

A production apparatus similar to that used in the experimental examples 1 to 3 except for the installation position of the heating device 11 was used to produce ozone water under conditions in Table 2. In the example 12, the heating device 11 was installed at a position so that the order of the respective steps including the heating step became (B) in FIG. 2. Specifically, an apparatus whose configuration was similar to that of the production apparatus 1A' of the heated ozone water was used. In the examples 13, 14, the heating device 11 was installed at a position so that the order of the respective steps including the heating step became (C) in FIG. 2. Specifically, an apparatus corresponding to the production apparatus 1A of the heated ozone water in which the place of installing the heating device 11 was changed from the liquid pipe 20 to the ozone water pipe 17, was used. Table 2 shows results obtained by measuring ozone concentrations of the obtained ozone water, saturated dissolution concentrations at respective conditions, and ratios of the ozone concentrations of the obtained heated ozone water to the saturated dissolution concentrations in percent figures (%).

TABLE 2

| | Production condition | | | | | | | | | | Physical property | | |
|---|---|---|---|---|---|---|---|---|---|---|---|---|---|
| | | | | Ozone gas | | | Acid water | | Supply amount ratio | Supply pressure difference | | | Saturated | Ratio |
| | Temperature (°C) | pH | Acid | Concentration (g/m³) | Supply flow rate FG (NL/min) | Supply pressure PG (MPa) | Supply flow rate FL (L/min) | Supply pressure PL (MPa) | between gas and acid water (FG/FL) | between gas and acid water (PL-PG) | Order of heating step | Ozone concentration (mg/L) | dissolution concentration of ozone (mg/L) | with respect to saturation (%) |
| Ex. 12 | 80 | 2.0 | Citric acid | 380 | 0.7 | 0.38 | 1 | 0.4 | 0.7 | 0.2 | (B) | 162 | 202 | 80.2 |
| Ex. 13 | 80 | 2.0 | Citric acid | | 0.7 | 0.38 | 1 | 0.4 | 0.7 | 0.2 | (C) | 130 | 202 | 64.4 |
| Ex. 14 | 80 | 2.0 | Citric acid | | 1 | 0.38 | 1 | 0.4 | 1 | 0.2 | (C) | 162 | 202 | 80.2 |

Examples 15 to 26

An apparatus being the production apparatus 1B of the heated ozone water similar to that illustrated in FIG. 4 in which a circulating pressure tank 30 was employed, was used, to produce ozone water under production conditions shown in Table 3. The specification of the apparatus except for the pressure tank 30 was similar to that of the production apparatus used in the examples 1 to 14 described above. As the pressure tank, one formed of a tank having a capacity of 10 L and a pressure pump (YD-10TTD manufactured by IWAKI CO., LTD.) was used. Note that a supply amount ratio between gas and acid water (FG/FL) was calculated based only on a supply flow rate including no circulation flow rate.

Table 3 shows results obtained by measuring ozone concentrations of the obtained ozone water, saturated dissolution concentrations at respective conditions, and ratios of the ozone concentrations of the obtained ozone water to the saturated dissolution concentrations in percent figures (%). The example 17 to the example 23 are working examples, and the examples 15, 16, 24 to 26 are comparative examples. Note that the ozone water obtained in each of the working examples is heated ozone water having a pH of 3 or less and a temperature of 60° C. or more. Regarding the ozone water obtained in each of the examples, the resist cleaning performance and the retention property of the ozone concentration were evaluated based on the above-described methods. Results are collectively shown in Table 3.

TABLE 3

| | Production condition | | | | | | | | | | Physical property | | Evaluation | | |
|---|---|---|---|---|---|---|---|---|---|---|---|---|---|---|---|
| | | | | Ozone gas | | Acid water | | Pressure tank | | Supply amount ratio between gas and acid water (FG/FL) | Ozone concentration (mg/L) | Saturated dissolution concentration of ozone (mg/L) | Ratio with respect to saturation (%) | Evaluation of cleaning performance | | |
| | Temperature (°C) | pH | Acid | Concentration (g/m³) | Supply flow rate FG (NL/min) | Supply pressure PG (MPa) | Supply flow rate FL (L/min) | Supply pressure PL (MPa) | Pressure (MPa) | Residence time (min) | | | | | Cleaning time (minute) | Cleaning Performance | Bubble amount |
| Ex. 15 | 20 | 2.8 | Citric acid | 380 | 2 | 0.28 | 1 circulation flow rate; 1 | 0.5 | 0.5 | 10 | 2 | 545 | 645 | 84 | 4 | B | A |
| Ex. 16 | 20 | 2.8 | Hydrochloric acid | | 2 | | | | | | 2 | 525 | 645 | 81 | 4 | B | A |
| Ex. 17 | 60 | 2.0 | Citric acid | | 1 | | | | | | 1 | 222 | 289 | 77 | 1.5 | A | A |
| Ex. 18 | 60 | 2.0 | Hydrochloric acid | | 1 | | | | | | 1 | 215 | 289 | 74 | 1.5 | A | A |
| Ex. 19 | 60 | 2.8 | Citric acid | | 1 | | | | | | 1 | 235 | 271 | 87 | 1.5 | A | A |
| Ex. 20 | 80 | 2.0 | Citric acid | | 1 | | | | | | 1 | 158 | 203 | 78 | 1 | A | A |
| Ex. 21 | 80 | 2.0 | Hydrochloric acid | | 1 | | | | | | 1 | 145 | 203 | 71 | 1 | A | A |
| Ex. 22 | 80 | 2.8 | Citric acid | | 1 | | | | | | 1 | 160 | 190 | 84 | 1 | A | A |
| Ex. 23 | 60 | 2.8 | Citric acid | | 0.5 | | | | | | 0.5 | 105 | 271 | 39 | 4 | A | A |
| Ex. 24 | 20 | 2.8 | Citric acid | | 1 | | | | | | 1 | 193 | 645 | 30 | 4 | C | A |
| Ex. 25 | 20 | 4.5 | Citric acid | | 2 | | | | | | 2 | 95 | 562 | 17 | 4 | C | C |
| Ex. 26 | 20 | 4.5 | Carbonic acid | | 2 | | | | | | 2 | 98 | 562 | 17 | 4 | C | C |

As shown in Table 3, it was confirmed that regarding the heated ozone water obtained in each of the working examples (the examples 17 to 23) by using the pressure tank, the ratio of the ozone concentration to the saturated dissolution concentration was high, and besides, the bubble amount was smaller than that of the examples 25, 26 being the comparative examples, and thus the amount of ozone reduced as bubbles was small when performing the resist stripping, similarly to the examples 3 to 9 when using the membrane dissolution module. The ozone water in each of the examples 15, 16, 24 being the comparative examples had a low liquid temperature, and thus was inferior in terms of the resist stripping performance. It can be understood that the heated ozone water obtained in each of the working examples is excellent in the resist stripping performance, and the heated ozone water whose ion concentration is 70% or more of the saturated dissolution concentration requires a short cleaning time.

Examples 27 to 31

In examples 27 to 31, ozone concentrations of ozone water obtained when using apparatuses similar to the production apparatuses 1B to 1E of the heated ozone water illustrated in FIG. 4 to FIG. 7, were measured. Table 4 shows production conditions and measured results of the ozone concentrations of the ozone water, saturated dissolution concentrations at the respective conditions, and ratios of the ozone concentrations of the obtained ozone water to the saturated dissolution concentrations in percent figures (%).

TABLE 4

| | | | | | Production condition | | | | | | | | Physical property | |
|---|---|---|---|---|---|---|---|---|---|---|---|---|---|---|
| | | | | | Ozone gas | | | Acid water | | | | Supply amount ratio | | |
| | | | | | Supply | Supply | | Supply | Supply | Pressure tank | | between | Saturated dissolution | Ratio with |
| | Production apparatus | Temperature (°C) | pH | Acid | Concentration (g/m³) | flow rate FG (NL/min) | pressure PG (MPa) | flow rate FL (L/min) | pressure PL (MPa) | Pressure (MPa) | Residence time (FG/FL) | gas and acid water (FG/FL) | Ozone concentration (mg/L) | concentration of ozone (mg/L) | respect to saturation (%) |
|---|---|---|---|---|---|---|---|---|---|---|---|---|---|---|---|
| Ex. 27 | 1B (circulation) | 60 | 2.2 | Citric acid | 380 | 3 | 0.5 | 1 circulation flow rate; 1 | 0.5 | 0.5 | 10 | 3 | 240 | 284 | 85 |
| Ex. 28 | 1B | | | | | 3 | | 1 | | | | 3 | 239 | 284 | 84 |
| Ex. 29 | 1C | | | | | 2 | | 1 | | | | 2 | 238 | 284 | 84 |
| Ex. 30 | 1D | | | | | 2 | | 1 | | | | 2 | 239 | 284 | 84 |
| Ex. 31 | 1E | | | | | 1 | | 1 | | | | 1 | 239 | 284 | 84 |

Note that the supply condition of the ozone gas in Table 4 indicates a supply condition under which the ozone gas is supplied to the device that performs the dissolution step or a pipe from the ozone supply unit 14 via the gas pipe 24. The supply condition of the acid water indicates a supply condition of acid water that is supplied to the pressure tank. The water temperature indicates a water temperature right behind the heating device, the pH indicates a pH right after the addition of acid, and the condition regarding the ozone gas indicates one in the gas pipe 24.

What is claimed is:

1. A method of producing heated ozone water obtained by dissolving ozone in pure water, the method comprising:
   adjusting a pH of the pure water to 3 or less by adding citric acid to the pure water, to obtain an acid water;
   dissolving an ozone gas in the acid water to obtain an ozone water; and
   heating the pure water, the acid water or the ozone water, to 60° C. or more.

2. The method of claim 1, wherein the dissolving of the ozone gas is performed by a method comprising membrane dissolution using a gas permeable membrane, pressure dissolution using a pressure tank, bubbling, and/or packed tower contact dissolution.

3. The method of claim 2, wherein the gas permeable membrane is a membrane comprising a fluorine-based material.

4. The method of claim 2, wherein the dissolving of the ozone gas is performed by the membrane dissolution, and
   wherein the heating is performed before the dissolving of the ozone gas.

5. The method of claim 2, wherein the dissolving of the ozone gas is performed by the pressure dissolution, and
   wherein the heating is performed after the dissolution of the ozone gas.

6. The method of claim 1, wherein an ozone concentration of the heated ozone water is 70% or more of a saturated dissolution concentration.

7. A heated ozone water, comprising:
   heated pure water comprising ozone dissolved in the heated pure water, as heated ozone water,
   wherein a pH of the heated ozone water is 3 or less,
   wherein the heated ozone water comprises citric acid,
   wherein a temperature of the heated ozone water is 60° C. or more, and
   wherein an ozone concentration of the heated ozone water follows equation (3):

$$C_{O3} \geq 350 - 2.5 = T_{HOW} \qquad (3),$$

$C_{O3}$ being ozone concentration in mg/L, and $T_{HOW}$ being liquid temperature of the heated ozone water in °C.

8. A semiconductor wafer-cleaning liquid, comprising:
   the heated ozone water of claim 7.

9. The semiconductor wafer-cleaning liquid of claim 8, which is a resist stripping liquid.

10. The method of claim 1, wherein the pH of the pure water in the adjusting is adjusted to a range of from 1.5 to 3.

11. The method of claim 1, wherein the pH of the pure water in the adjusting is adjusted to a range of from 1.7 to 3.

12. The method of claim 1, wherein the pH of the pure water in the adjusting is adjusted to a range of from 1.7 to 2.5.

13. The heated ozone water of claim 7, wherein the pH of the heated ozone water is in a range of from 1.5 to 3.

14. The heated ozone water of claim 7, wherein the pH of the heated ozone water is in a range of from 1.7 to 3.

15. The heated ozone water of claim 7, wherein the pH of the heated ozone water is in a range of from 1.7 to 2.5.

16. The method of claim 1, wherein a volume ratio of the acid water to the ozone gas is in a range of from 1:0.5 to 1:20.

17. The method of claim 1, wherein a volume ratio of the acid water to the ozone gas is in a range of from 1:0.7 to 1:7.

18. The method of claim 1, wherein a volume ratio of the acid water to the ozone gas is in a range of from 1:1 to 1:5.

19. The method of claim 1, wherein an ozone concentration of the ozone water after the heating is in a range of from 150 to 250 mg/L.

20. The heated ozone water of claim 7, having an ozone concentration in a range of from 150 to 250 mg/L.

* * * * *